US009053908B2

(12) United States Patent
Sriraman et al.

(10) Patent No.: US 9,053,908 B2
(45) Date of Patent: Jun. 9, 2015

(54) METHOD AND APPARATUS FOR CONTROLLING SUBSTRATE DC-BIAS AND ION ENERGY AND ANGULAR DISTRIBUTION DURING SUBSTRATE ETCHING

(71) Applicant: Lam Research Corporation, Fremont, CA (US)

(72) Inventors: Saravanapriyan Sriraman, Fremont, CA (US); Alexander Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/031,793

(22) Filed: Sep. 19, 2013

(65) Prior Publication Data

US 2015/0076112 A1 Mar. 19, 2015

(51) Int. Cl.
*C03C 15/00* (2006.01)
*H01J 37/32* (2006.01)

(52) U.S. Cl.
CPC .................................. *H01J 37/32082* (2013.01)

(58) Field of Classification Search
USPC .................. 216/37, 67; 156/345; 219/121.41, 219/121.43
See application file for complete search history.

(56) References Cited

U.S. PATENT DOCUMENTS 6,095,084 A * 8/2000 Shamouilian et al. .... 118/723 E
6,201,208 B1 * 3/2001 Wendt et al. ............. 219/121.41

OTHER PUBLICATIONS

Sang-Heon Song et al. Plasma Sources Sci. Technol. vol. 21, (2012) pp. 1-17.*

* cited by examiner

*Primary Examiner* — Duy Deo
*Assistant Examiner* — Maki Angadi
(74) *Attorney, Agent, or Firm* — Martine Penilla Group, LLP

(57) ABSTRACT

A variable capacitor is provided within a radiofrequency (RF) power transmission path to a bias electrode, in addition to an impedance matching circuit provided within the RF power transmission path to the bias electrode. An RF power supply is operated in a pulsed mode to transmit pulses of RF power through the RF power transmission path to the bias electrode. A capacitance of the variable capacitor is set to control a rate at which a DC bias voltage builds up on a substrate present above the bias electrode during each pulse of RF power. The rate at which the DC bias voltage builds up on the substrate controls an ion energy distribution and an ion angular distribution within a plasma exposed to an electromagnetic field emanating from the substrate.

20 Claims, 15 Drawing Sheets

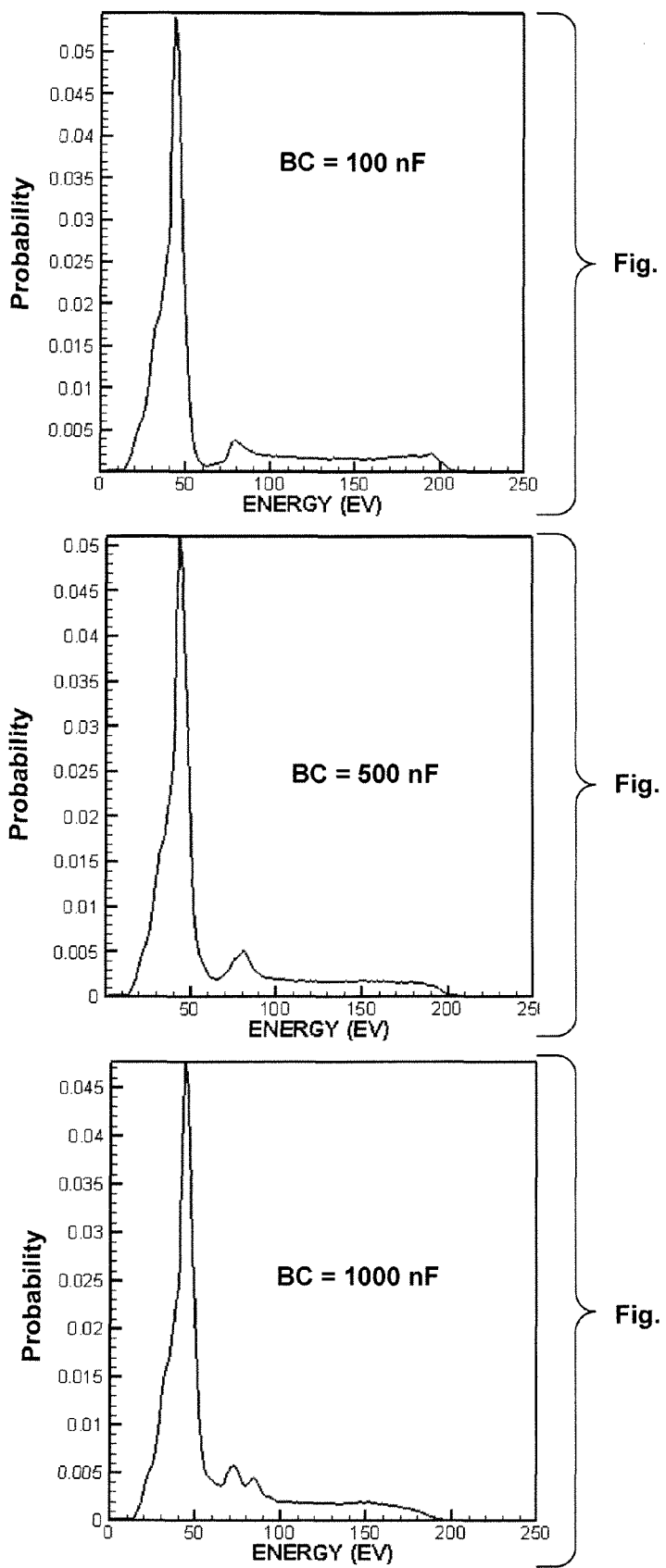

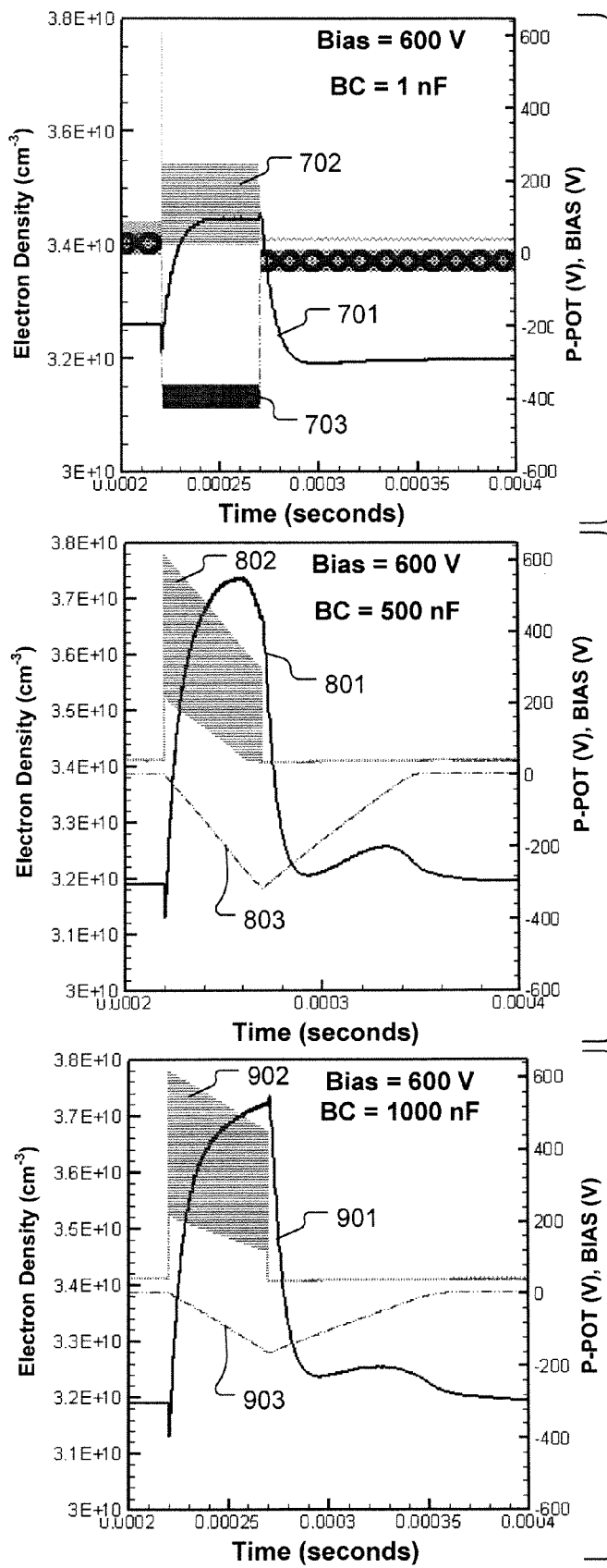

METHOD AND APPARATUS FOR CONTROLLING SUBSTRATE DC-BIAS AND ION ENERGY AND ANGULAR DISTRIBUTION DURING SUBSTRATE ETCHING

BACKGROUND

In the fabrication of semiconductor devices such as integrated circuits, memory cells, and the like, a series of manufacturing operations are performed to define features on a substrate, such as a semiconductor wafer. For example, the integrated circuits are formed by multi-level structures defined on a silicon substrate. At a substrate level, transistor devices with diffusion regions and gate electrode conductors are farmed. In higher levels above the substrate level, interconnect metallization lines are patterned and electrically connected to the transistor devices to define a desired integrated circuit device. Also, patterned conductive structures/layers are insulated from other conductive structures/layers by dielectric materials.

As part of the semiconductor device fabrication process, plasma etching processes are often utilized to remove selected materials previously deposited on the substrate so as to pattern, shape, or otherwise manipulate the materials on the substrate into structures needed to form part of the integrated circuit device. The plasma etching process involves generation of a plasma, including reactive constituents such as radicals and ions, and exposure of the substrate to the radicals and ions of the plasma in a controlled manner. It is within this context that the present invention arises.

SUMMARY

In one embodiment, a method is disclosed for controlling ions during plasma processing of a substrate. The method includes providing a variable capacitor within a radiofrequency (RF) power transmission path to a bias electrode. The variable capacitor is provided in addition to an impedance matching circuit within the RF power transmission path to the bias electrode. The method also includes operating an RF power supply in a pulsed mode to transmit pulses of RF power through the RF power transmission path to the bias electrode. The method further includes setting a capacitance of the variable capacitor to control a rate at which a direct current (DC) bias voltage builds up on a substrate present above the bias electrode during each pulse of RF power, whereby the rate at which the DC bias voltage builds up on the substrate controls an ion energy distribution and an ion angular distribution within a plasma exposed to an electromagnetic field emanating from the substrate.

In one embodiment, a system for controlling ions during plasma processing of a substrate is disclosed. The system includes a chuck defined to support a substrate in exposure to a plasma. The system also includes a bias electrode embedded within the chuck. The system also includes an RF power supply defined to operate in a pulsed mode to transmit pulses of RF power through an RF power transmission path to the bias electrode. The system also includes an impedance matching circuit electrically connected within the RF power transmission path between the RF power supply and the bias electrode. The system also includes a variable capacitor electrically connected within the RF power transmission path. The variable capacitor is defined to control a rate at which a DC bias voltage builds up on the substrate during each pulse of RF power, whereby the rate at which the DC bias voltage builds up on the substrate controls an ion energy distribution and an ion angular distribution within the plasma exposed to an electromagnetic field emanating from the substrate.

Other aspects and advantages of the invention will become more apparent from the following detailed description, taken in conjunction with the accompanying drawings, illustrating by way of example the present invention.

BRIEF DESCRIPTION OF THE DRAWINGS

FIGS. 4B, 5B, and 6B show ion energy distributions corresponding to the pulsed bias RF power operations of FIGS. 4A, 5A, and 6A, respectively, in accordance with one embodiment of the present invention.

FIGS. 7A, 8A, and 9A show plots of electron density, plasma potential (V), and DC bias voltage build up on the substrate for a single pulse period in a pulsed bias RF power supply mode for blocking capacitor BC capacitance values of 1 nF, 500 nF, and 1000 nF, respectively, in accordance with one embodiment of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
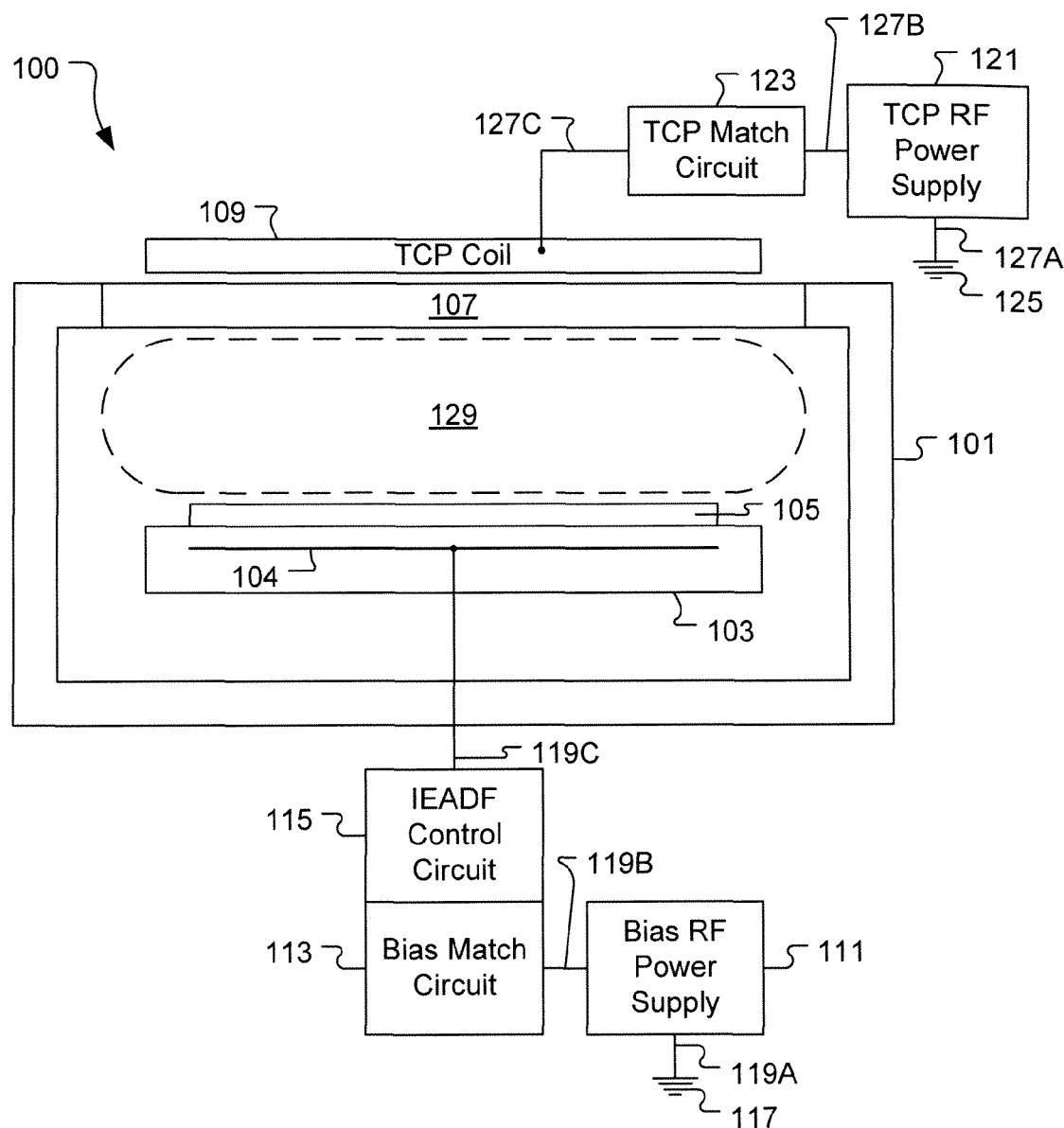
FIG. 1A shows an architectural view of a plasma processing system utilized for etching operations, in accordance with one embodiment of the present invention.
Figure 1B:
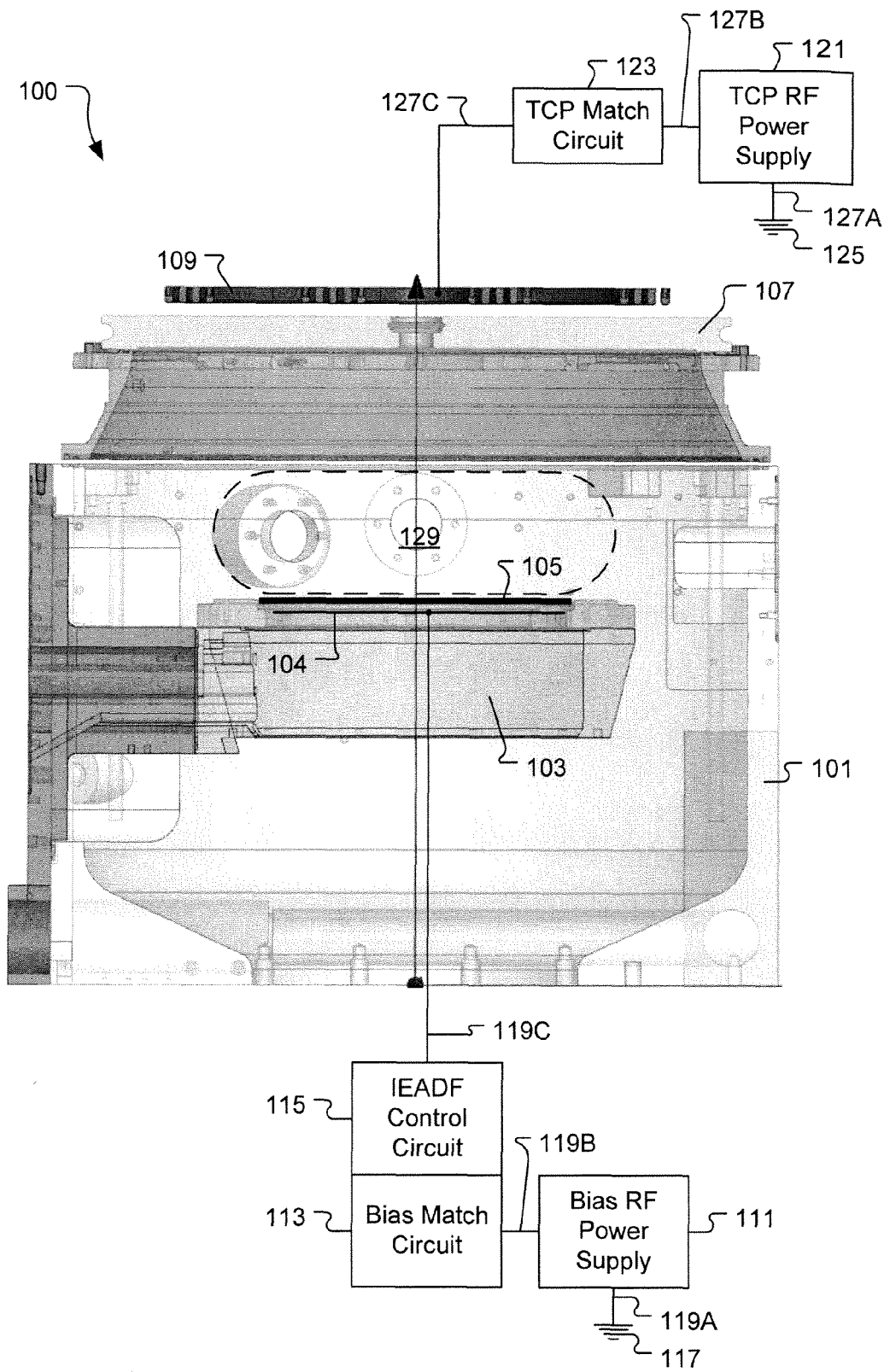
FIG. 1B shows a design view of the plasma processing system, in accordance with one embodiment of the present invention.

FIG. 1A shows an architectural view of a plasma processing system 100 for etching operations, in accordance with one embodiment of the present invention. FIG. 1B shows a design view of the plasma processing system 100, in accordance with one embodiment of the present invention. The system includes a chamber 101 that includes a chuck 103, and a dielectric window 107. The chuck 103 is defined to support a substrate 105 during plasma processing operations. A substrate, as referred to herein, denotes without limitation, semiconductor wafers, hard drive disks, optical discs, glass substrates, flat panel display surfaces, liquid crystal display surfaces, among essentially any other type of substrate present during semiconductor device fabrication. In one embodiment, the chuck 103 is an electrostatic chuck for supporting and holding the substrate 105. In another embodiment, the chuck 103 is defined to hold the substrate 105 by physical restraint. The chuck 103 includes one or more bias electrodes 104 (bias electrode 104 hereafter) connected to receive radiofrequency (RF) power from a bias RF power supply 111, by way of a bias match circuit 113 and an ion energy and angular distribution function (IEADF) control circuit 115. The bias RF power supply 111 is connected between a reference ground potential 117 and the bias match circuit 113, as indicated by electrical connections 119A and 119B. The bias match circuit 113 is electrically connected to the IEADF control circuit 115, which is in turn electrically connected to the bias electrode 104, as indicated by electrical connection 119C.

In one embodiment where the chuck 103 is defined as an electrostatic chuck, the chuck 103 includes clamp electrodes (not shown) to enable the chucking and de-chucking of the substrate 105. Also, in this embodiment, a filter and a direct current (DC) clamp power supply are provided to effect electrostatic clamping of the substrate 105 to the chuck 103 by way of the clamp electrodes. Also, the chuck 103 can include other control systems, such as lifting pins or the like, for receiving the substrate 105, lowering the substrate 105 onto the chuck 103, and lifting the substrate 105 off of the chuck 103. Additionally, although not shown, pumps are connected to the chamber 101 to provide for control of pressure within the chamber 101, and for exhausting of gaseous byproducts from the chamber 101 during plasma processing operations.

In various embodiments, the dielectric window 107 is defined from a dielectric material, such as a ceramic material or quartz, among others. It should be understood that in other embodiments the dielectric window 107 can be defined from other dielectric materials, so long as the dielectric window 107 is capable of withstanding the conditions to which it is exposed during plasma processing operations within the chamber 101. In some plasma processing operations, the chamber 101 is operated at elevated temperatures within a temperature range extending from about 50 Celsius (C) to about 12° C. In general, the temperature within the chamber 101 will depend on the specific etching process performed. Also, the chamber 101 can operate at reduced-pressure conditions within a pressure range extending from about 1 milliTorr (mT) to about 100 mT.

The system 100 also includes a TCP (transformer coupled plasma) coil 109 disposed over the dielectric window 107 outside the chamber 101. The TCP coil 109 is connected to receive RF power from a TCP RF power supply 121, by way of a TCP match circuit 123. Specifically, the TCP RF power supply 121 is electrically connected between a reference ground potential 125 and the TCP match circuit 123, as indicated by electrical connections 127A and 127B. The TCP match circuit 123 is electrically connected between the TCP power supply 121 and the TCP coil 109, as indicated by electrical connections 127B and 127C. The TCP match circuit 123 is defined to control an impedance of the RF power transmission path to the TCP coil 109, so as to provide for efficient transmission of the RF power to the TCP coil 109.

During plasma processing operations, a process gas is flowed into the chamber 101, and RF power is supplied from the TCP RF power supply 121 to the TCP coil 109. The RF power passing through the TCP coil 109 induces an electromagnetic current in the chamber 101, which acts on the process gas to generate the plasma 129. In this manner, the TCP coil 109 behaves as a primary coil of a transformer, and the plasma 129 behaves as a secondary coil of the transformer. The plasma 129 includes reactive constituents, such as radicals and ions (positive and negative), which act to remove, i.e., etch, materials from the substrate 105 upon contact with the substrate 105.

It should be understood that when the chamber 101 is installed in a fabrication facility, the chamber 101 is coupled to systems that provide for supply of process gases to the chamber 101, exhaust of process gases and byproducts from the chamber 101, monitoring and control of pressure within the chamber 101, monitoring and control of temperature within the chamber 101, and environmental particle control. Also, it should be understood that the chamber 101 can be coupled to a transfer chamber defined to provide for robotic transfer of the substrate 105 into the chamber 101 and robotic removal of the substrate 105 from the chamber 101.

During operation, RF power is transmitted from the bias RF power supply 111 to the bias electrode 104, by way of the bias match circuit 113 and IEADF control circuit 115, to generate and control a direct current (DC) bias voltage present on the substrate 105, which in turns controls a force exerted on an ion population present within the plasma 129 generated above the substrate 105. The RF power transmitted to the bias electrode 104 corresponds to an RF bias voltage applied to the bias electrode 104. Both the DC bias voltage that builds up on the substrate 105 and the RF bias voltage applied to the bias electrode 104 occur simultaneously as a result of applying the RF power from the bias RF power supply 111 to the bias electrode 104, by way of the bias match circuit 113 and IEADF control circuit 115. Therefore, the IEADF control circuit 115 within the bias RF power supply affects both the DC bias voltage on the substrate 105 and the RF bias voltage on the bias electrode 104.

The DC bias voltage is a representation of the average ion energy at a particular point on the substrate 105. The DC bias voltage builds up on the substrate 105 as substrate 105 charging occurs. The IEADF control circuit 115 controls the rate at which the DC bias voltage evolves in a pulsed bias RF power supply mode. In a continuous wave (CW) bias RF power supply mode, the DC bias voltage on the substrate 105 is allowed to reach a steady-state. Therefore, in the CW bias RF power supply mode, the effect of the IEADF control circuit 115 on the DC bias voltage on the substrate 105 is not relevant. Also, it should be understood that the RF waveform seen at the plasma 129 sheath edge (after the bias match circuit 113 and all the capacitive layers in the chuck 103) will be controlled by the IEADF control circuit 115. And, ions respond to the RF waveform at the plasma 129 sheath edge to populate the IEADF accordingly as the ions accelerate toward the substrate 105.

In various embodiments, the RF power supply 111 can be defined to include either a single RF generator or multiple RF generators. Also, the RF power supply 111 can be defined to generate RF power at one or more frequencies. And, in the case of multiple RF generators, the RF power supply 111 can generate RF power at multiple frequencies in a simultaneous manner. The bias match circuit 113 is defined to control an impedance of the RF power transmission path to the bias electrode 104, so as to provide for efficient transmission of the RF power to the bias electrode 104.

The plasma processing chamber 101 utilizes the RF bias power as generated by the RF power supply 111 at various frequencies to generate and control the energetic ion population arriving at the exposed surface of the substrate 105 during plasma processing operations. Depending on the particular etch application being performed, it may be important to control the fraction of ion population at various energies and the associated ion energy and angular distribution functions (IEADF) arriving at the substrate 105. Pulsing of the bias RF power supply 111, i.e., bias pulsing, can be utilized to generate an IEADF at the substrate 105. Bias pulsing operation causes transit of ion populations from various energies toward the substrate 105 over a time period associated with a pulse repetition frequency (PRF) and a pulse duty cycle (D.C.) of the supplied bias RF power. However, it is also necessary during bias pulsing operation to control the IEADF to which the substrate 105 is exposed in order to obtain a specific plasma processing result on the substrate 105. In accordance with various embodiments of the present invention, the IEADF circuit 115 is defined and operated to control the IEADF during bias pulsing operation in order to control populations of low and high energy ions to which the substrate 105 is exposed.

Figure 2:
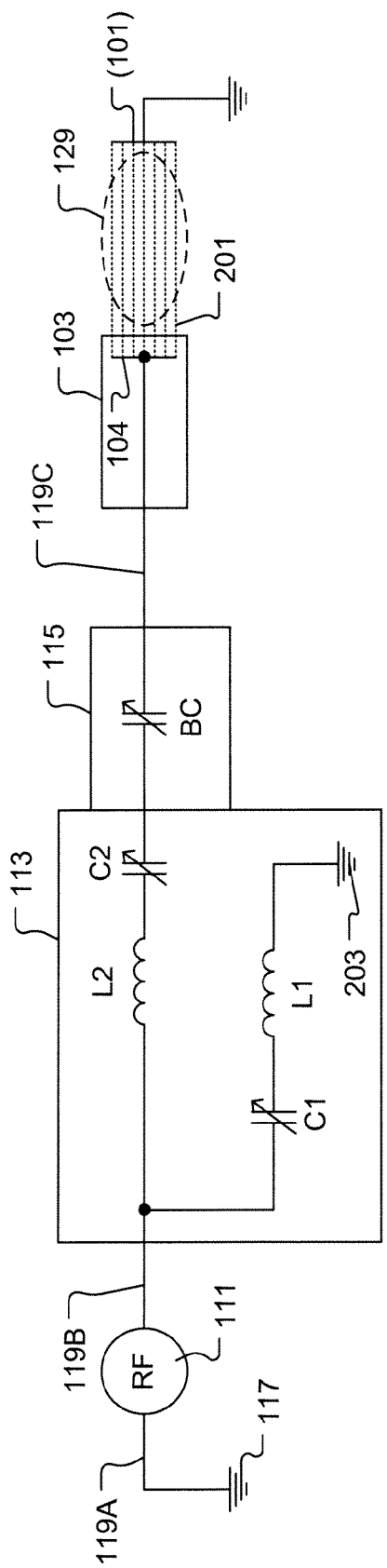
FIG. 2 shows an electrical schematic of the bias RF power supply circuit, in accordance with one embodiment of the present invention.

FIG. 2 shows an electrical schematic of the bias RF power supply circuit, in accordance with one embodiment of the present invention. As discussed with regard to FIGS. 1A-1B, the bias RF power is supplied from the bias RF power supply 111, through the bias match circuit 113, through the IEADF circuit 115, to the bias electrode 104. From the bias electrode 104, the bias RF power is transmitted through the plasma 129 to surrounding structures of the chamber 101 that are electrically grounded, as indicated by lines 201. Circuit components within the bias match circuit 113 provide impedance matching to enable efficient transmission of the bias RF power through the plasma 129. The bias match circuit 113 includes a first inductor L1 and a first variable capacitor C1 electrically connected in a serial manner between the bias RF power transmission line 119B and a reference ground potential 203. The bias match circuit 113 also includes a second inductor L2 and a second variable capacitor C2 electrically connected in a serial manner along the bias RF power transmission line 119B/119C that extends to the bias electrode 104. During operation, the first and second variable capacitors C1 and C2 are independently set to obtain a necessary impedance match for efficient transmission of the bias RF power through the plasma 129.

The IEADF control circuit 115 includes one or more blocking capacitors BC electrically connected along the bias RF power transmission line 119B/119C that extends to the bias electrode 104. For ease of discussion, the IEADF control circuit 115 is described herein with regard to a single blocking capacitor BC. However, it should be understood that in other embodiments, the IEADF control circuit 115 can include multiple blocking capacitors BC's, and the multiple blocking capacitors BC's can be electrically connected in either a serial manner, parallel manner, or combination thereof, along the bias RF power transmission line 119B/119C that extends to the bias electrode(s) 104. During operation, the blocking capacitor BC is set to control the IEADF within the plasma 129 to which the substrate 105 is exposed.

The bias RF power supply circuit of FIG. 2 can be operated in either continuous wave bias RF power supply mode or pulsed bias RF power supply mode. However, as discussed below, the IEADF control effects provided by the blocking capacitor BC within the IEADF control circuit 115 is present when the bias RF power supply circuit is operated in pulsed bias RF power supply mode. To explain the IEADF control effects provided by the blocking capacitor BC within the IEADF control circuit 115 when the bias RF power supply circuit is operated in pulsed bias RF power supply mode, it is instructive to first explain how the IEADF behaves when the bias RF power supply circuit is operated in continuous wave bias RF power supply mode.

Figure 3A:
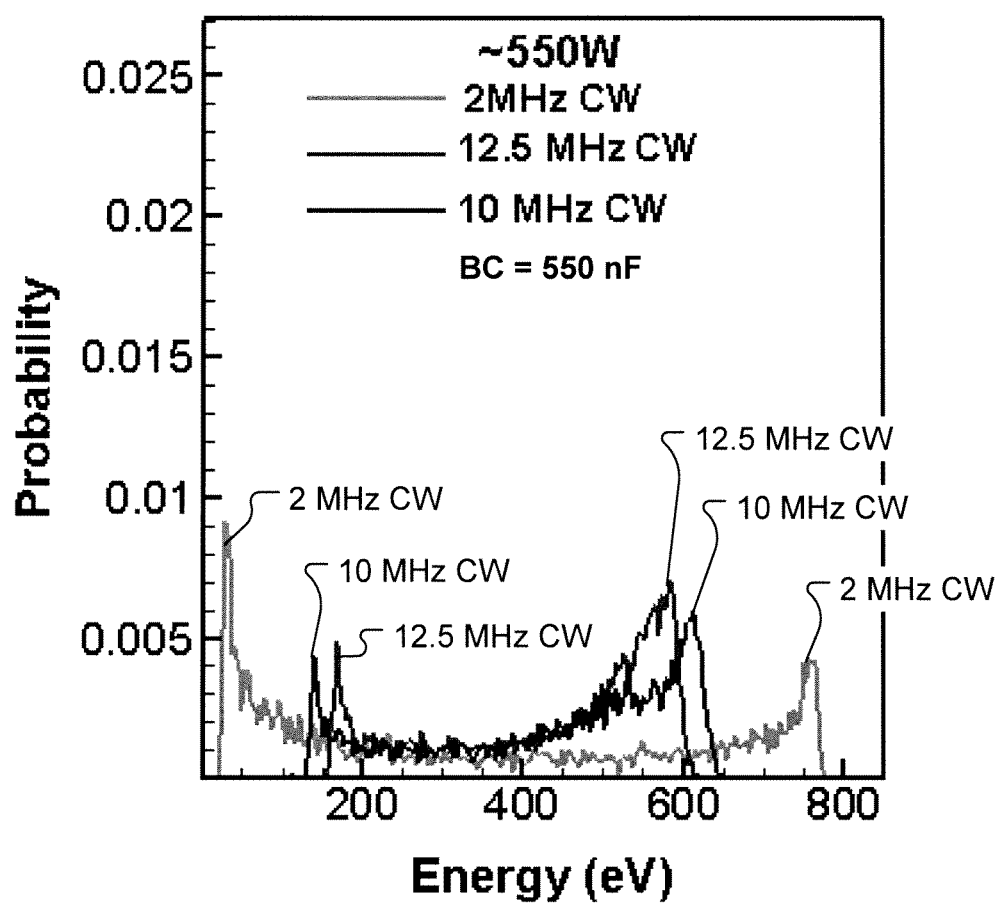
FIG. 3A shows plots of ion energy distribution in a plasma, such as the plasma, at different frequencies of continuous wave bias RF power, in accordance with one embodiment of the present invention.

FIG. 3A shows plots of ion energy distribution in a plasma, such as the plasma 129, at different frequencies of continuous wave bias RF power, in accordance with one embodiment of the present invention. It should be understood that each ion energy distribution in the plasma or IEADF present herein corresponds to a particular location on the substrate 105. The plasma is generated at a pressure of 10 mT, a gas flow of 200 sccm (standard cubic centimeters) of Ar, an inductive coil power of 500 W (Watt), and an RF bias voltage of 400 V (Volt) applied to the bias electrode 104. The blocking capacitor is set at 550 nF. As shown, the lower continuous wave RF frequency of 2 MHz (megaHertz) has an ion energy distribution over an energy range extending from less than 25 eV (electron volt) to more than 750 eV. The next higher continuous wave RF frequency of 10 MHz has an ion energy distribution over a narrower energy range extending from about 125 eV to about 650 eV. The next higher continuous wave RF frequency of 12.5 MHz has an ion energy distribution over a narrower energy range extending from about 150 eV to about 600 eV. Based on FIG. 3A, it should be understood that the ion energy distribution converges to a narrower energy range as the continuous wave RF frequency increases for a given blocking capacitor capacitance value.

Figure 3B:
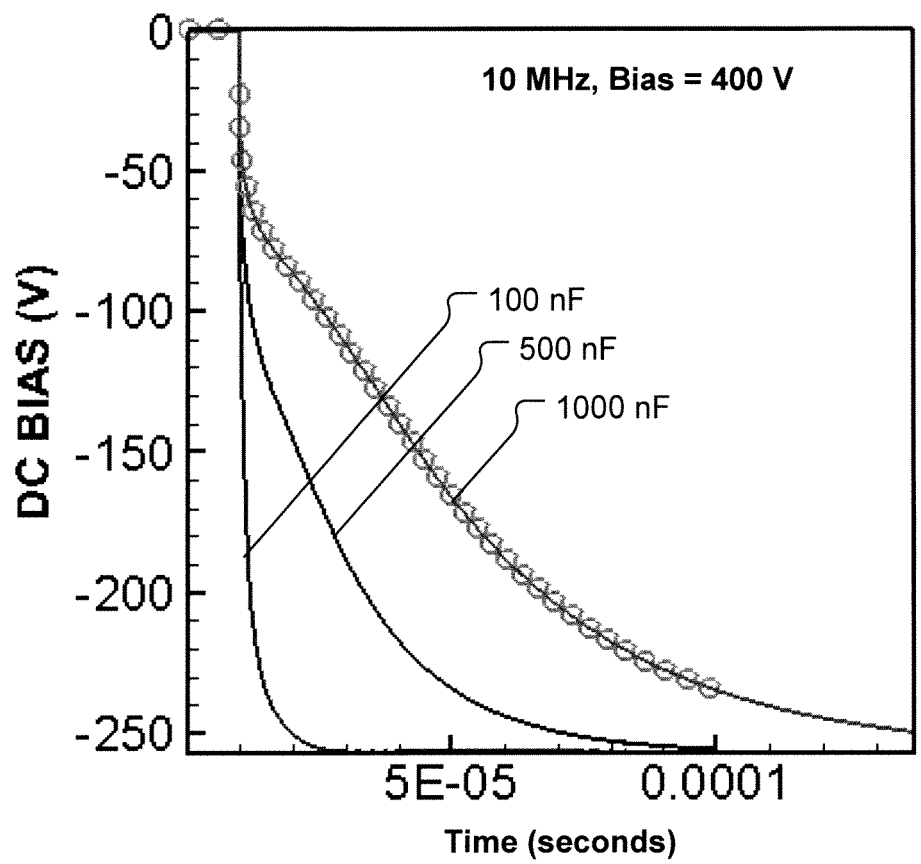
FIG. 3B shows plots of the DC bias voltage generated on the substrate as a function of time during startup of a continuous wave bias RF power supply for different capacitances of the blocking capacitor BC, in accordance with one embodiment of the present invention.

FIG. 3B shows plots of the DC bias voltage generated on the substrate 105 as a function of time during startup of a continuous wave bias RF power supply for different capacitances of the blocking capacitor BC, in accordance with one embodiment of the present invention. The plots shown in FIG. 3B correspond to continuous wave bias RF power supplied at a frequency of 10 MHz. As shown, larger capacitances of the blocking capacitor BC have longer discharge times. In following, larger capacitances of the blocking capacitor BC correspond to longer times for the DC bias voltage to buildup on the substrate 105. Therefore, the capacitance of the blocking capacitor BC can be set to control a rate at which the DC bias voltage rises on the substrate 105 when the bias RF power supply 111 is turned on, with the rate of DC bias voltage rise increasing with lower capacitance blocking capacitor BC setting, vice-versa.

Figure 3C:
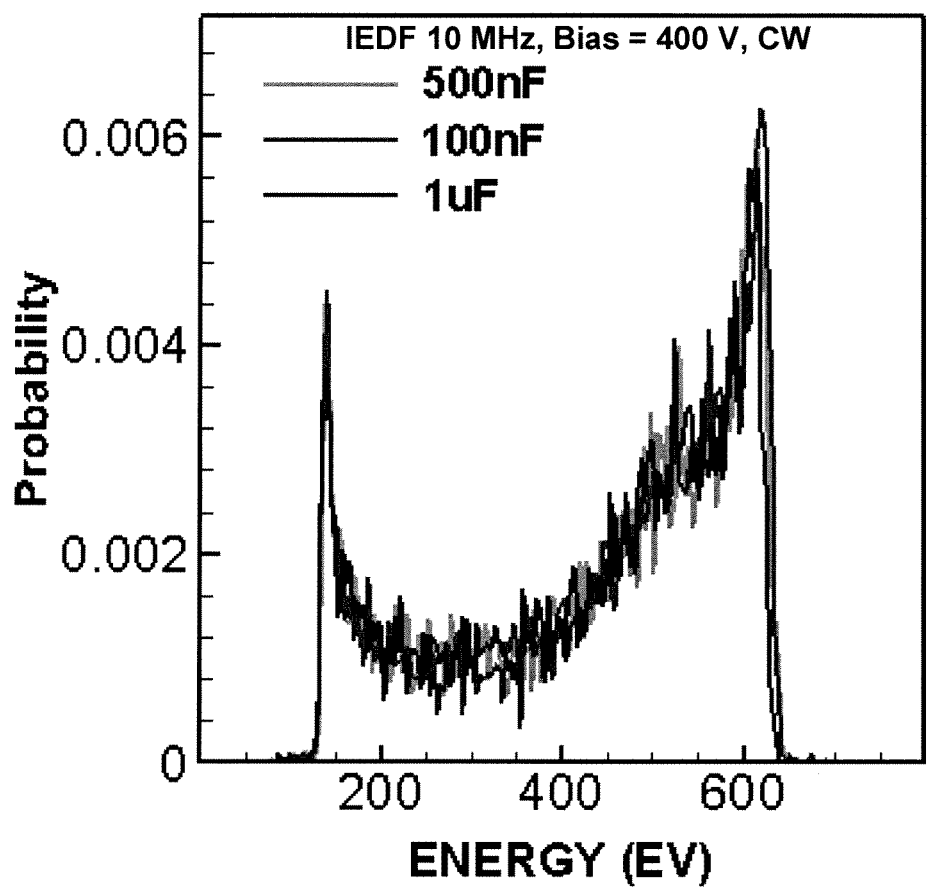
FIG. 3C shows plots of ion energy distribution in the plasma for different capacitance settings of the blocking capacitor BC during steady-state continuous wave bias RF power supply at an RF frequency of 10 MHz, in accordance with one embodiment of the present invention.

FIG. 3C shows plots of ion energy distribution in the plasma for different capacitance settings of the blocking capacitor BC during steady-state continuous wave bias RF power supply at an RF frequency of 10 MHz, in accordance with one embodiment of the present invention. As shown, during steady-state continuous wave bias RF power operation, the blocking capacitor BC has fully discharged and has essentially no affect on the ion energy distribution in the plasma, regardless of the capacitance setting of the blocking capacitor BC. Therefore, it should be appreciated that the blocking capacitor BC exerts an influence on the ion energy distribution during the buildup of the DC bias voltage on the substrate 105 prior to reaching the steady-state condition.

During the pulsed bias RF power supply mode, the DC bias voltage on the substrate 105 may not reach steady-state during the RF power pulse. Therefore, during the pulsed bias RF power supply mode, when the RF power pulse is initiated, the DC bias voltage on the substrate 105 begins to buildup, such as depicted in FIG. 3B. Then, when the RF power pulse is turned off, the DC bias voltage on the substrate 105 rapidly goes away. Because the blocking capacitor BC influences the rate at which the DC bias voltage builds up on the substrate 105 upon initiation of RF power supply to the bias electrode 104, the blocking capacitor BC will influence the rate at which the DC bias voltage builds up on the substrate 105 from the beginning of each RF power pulse during the pulsed bias RF power supply mode. Therefore, it should be understood that by controlling the rate at which the DC bias voltage builds up on the substrate 105 during each RF pulse in the pulsed bias RF power supply mode, the blocking capacitor BC capacitance setting provides for corresponding control of the IEADF within the plasma during each RF pulse in the pulsed bias RF power supply mode.

Figure 4A:
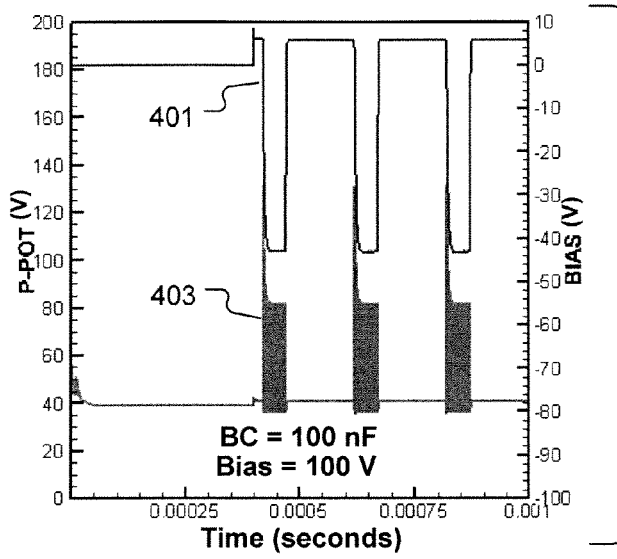
FIGS. 4A, 5A, and 6A shows plots of the DC bias voltage build up on the substrate and the corresponding plasma potential for different capacitance settings of the blocking capacitor BC during the pulsed bias RF power supply mode, in accordance with one embodiment of the present invention.
Figure 5A:
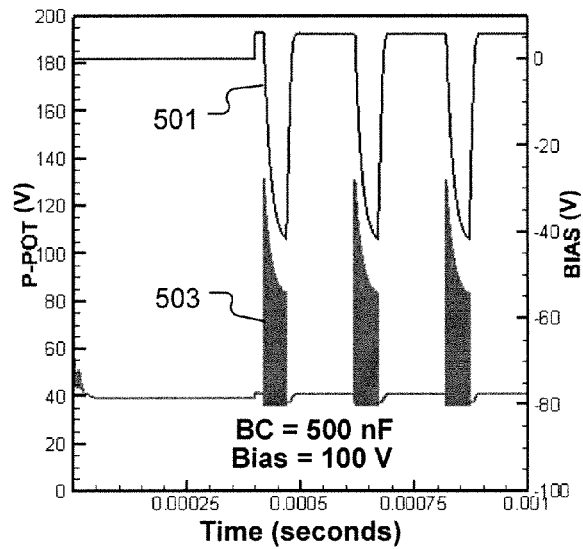
Figure 6A:
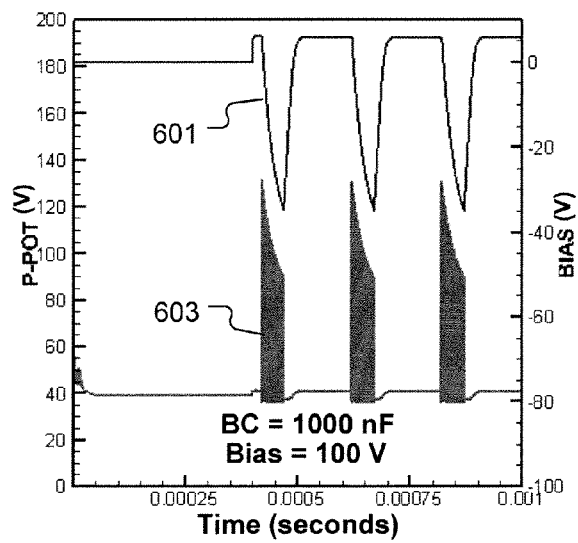

FIGS. 4A, 5A, and 6A shows plots of the DC bias voltage build up on the substrate 105 and the corresponding plasma potential for different capacitance settings of the blocking capacitor BC during the pulsed bias RF power supply mode, in accordance with one embodiment of the present invention. FIG. 4A illustrates the DC bias voltage on the substrate 105 in the upper plot 401 and the corresponding plasma potential in the lower plot 403, as a function of time over three successive bias RF power pulses, at a blocking capacitor BC capacitance setting of 100 nF (nanoFarad), in accordance with one embodiment of the present invention. FIG. 5A illustrates the DC bias voltage on the substrate 105 in the upper plot 501 and the corresponding plasma potential in the lower plot 503, as a function of time over three successive bias RF power pulses, at a blocking capacitor BC capacitance setting of 500 nF, in accordance with one embodiment of the present invention. FIG. 6A illustrates the DC bias voltage on the substrate 105 in the upper plot 601 and the corresponding plasma potential in the lower plot 603, as a function of time over three successive bias RF power pulses, at a blocking capacitor BC capacitance setting of 1000 nF, in accordance with one embodiment of the present invention.

Also, the plasma generation specifications are the same for each of FIGS. 4A, 5A, and 6A. Specifically, the plasma is generated at a pressure of 10 mT, a gas flow of 200 sccm of Ar, an TCP coil power of 500 W, an RF power frequency of 10 MHz, a bias pulse repetition frequency (PRF) of 5 kHz, and a 25% bias pulse duty cycle (D.C.). The PRF defines the rate at which the bias pulse is initiated. The bias pulse duty cycle defines the amount of time that the bias RF power is applied, i.e., turned on, during a single bias pulse period.

Because the plasma generation specifications are the same for each of FIGS. 4A, 5A, and 6A, the differences between the DC bias voltage on the substrate 105 as shown in the upper plots 401, 501, 601 are due to the difference in the blocking capacitor BC capacitance settings. Similarly, the differences between the plasma potential behavior in the lower plots 403, 503, 603 are also due to the difference in the blocking capacitor BC capacitance settings. Comparison of the upper plots 401, 501, and 601 shows that as the capacitance setting of the blocking capacitor BC increases, the rate at which the DC bias voltage rises on the substrate 105 decreases, vice-versa. Similarly, comparison of the lower plots 403, 503, 603 shows that larger capacitance settings of the blocking capacitor BC corresponds to lower rates of plasma potential increase, vice-versa.

The rate at which the plasma potential increases during each bias RF power pulse has a corresponding influence the IEADF within the plasma. Therefore, changes in the capacitance setting of the blocking capacitor BC corresponds to changes in the IEADF within the plasma. Hence, the blocking capacitor BC can be used to control the IEADF within the plasma. This effect is illustrated in FIGS. 4B, 5B, and 6B, which correspond to the pulsed bias RF power operations of FIGS. 4A, 5A, and 6A, respectively. FIG. 4B shows the ion energy distribution function within the plasma corresponding to the pulsed bias RF power operation of FIG. 4A, with a blocking capacitor BC capacitance setting of 100 nF, in accordance with one embodiment of the present invention. FIG. 5B shows the ion energy distribution function within the plasma corresponding to the pulsed bias RF power operation of FIG. 5A, with a blocking capacitor BC capacitance setting of 500 nF, in accordance with one embodiment of the present invention. FIG. 6B shows the ion energy distribution function within the plasma corresponding to the pulsed bias RF power operation of FIG. 6A, with a blocking capacitor BC capacitance setting of 1000 nF, in accordance with one embodiment of the present invention.

Comparisons of the ion energy distribution functions of FIGS. 4B, 5B, and 6B shows that with the lower capacitance blocking capacitor BC setting, the correspondingly higher rate of increase in plasma potential during each bias RF power pulse causes a shift in the ion energy distribution function toward higher ion energy. This effect occurs because the plasma experiences a higher potential on average during the pulsed bias RF power supply mode due to the more rapid build up of DC bias voltage on the substrate 105, which is due to the more rapid discharge of the lower capacitance blocking capacitor BC during each bias RF power pulse. Correspondingly, with the higher capacitance blocking capacitor BC setting, the lower rate of increase in plasma potential during each bias RF power pulse causes a shift in the ion energy distribution function toward lower ion energy. And, this effect occurs because the plasma experiences a lower potential on average during the pulsed bias RF power supply mode due to the slower build up of DC bias voltage on the substrate 105, which is due to the slower discharge of the higher capacitance blocking capacitor BC during each bias RF power pulse. Therefore, it should be understood that the blocking capacitor BC can be set to control the average ion energy distribution function within the plasma during pulsed bias RF power operation. And, the average ion energy distribution function within the plasma shifts toward lower ion energies as the capacitance of the blocking capacitor increases, vice-versa.

Figure 6C:
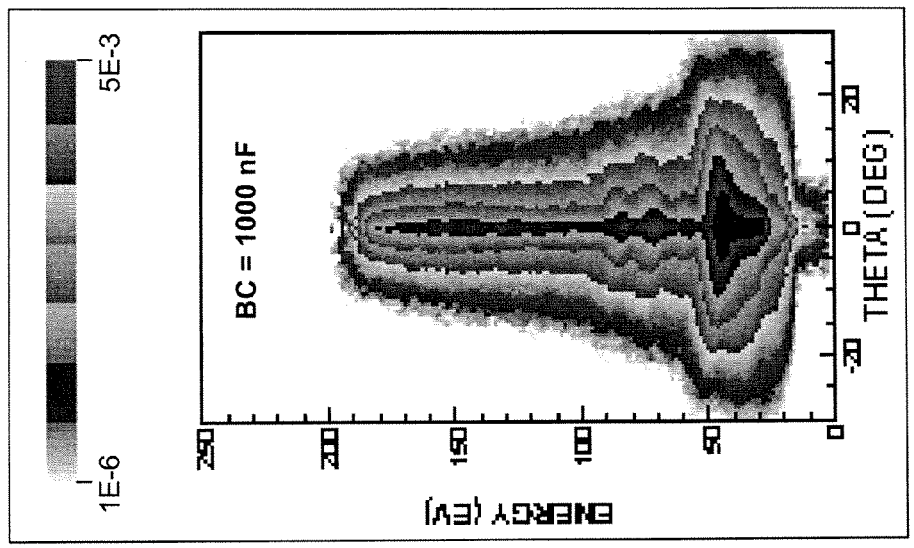
FIGS. 4C, 5C, and 6C show the ion angular distribution functions corresponding to the ion energy distribution functions of FIGS. 4B, 5B, and 6B, respectively, in accordance with one embodiment of the present invention.
Figure 5C:
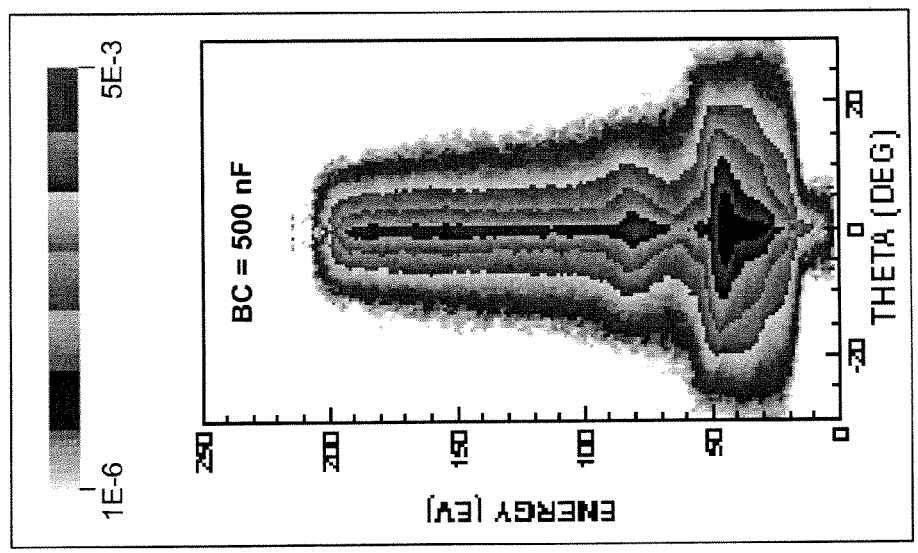
Figure 4C:
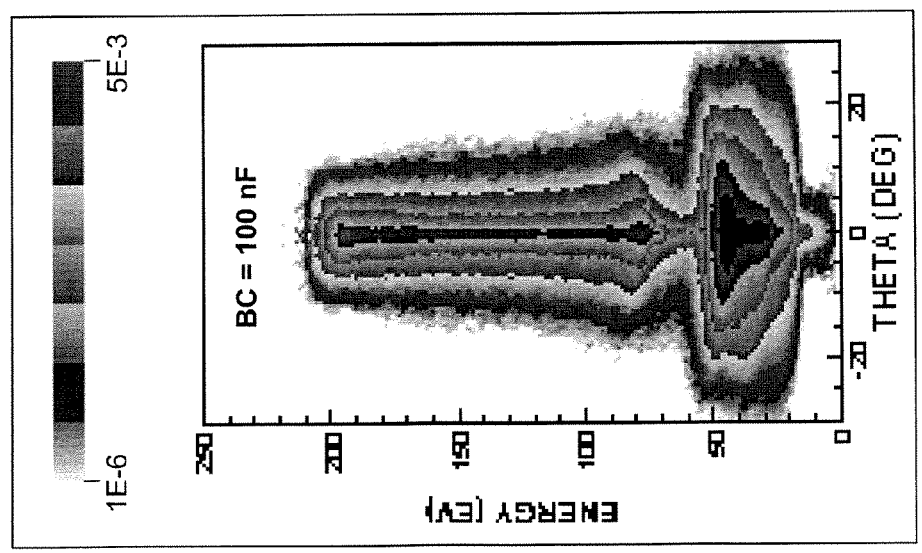

The ion angular distribution function is closely tied to the ion energy distribution function in that ions of higher energy are more strongly attracted toward the substrate 105 as compared to ions of lower energy. The more strongly attracted ions of higher energy move toward the substrate 105 in a more direct path, so as to travel in a more perpendicular direction toward the substrate 105. Therefore, the ion angular distribution function becomes more perpendicularly, i.e., orthogonally, related to the substrate 105 as the ion energy distribution function is shifted toward higher energy. This effect is shown in FIGS. 4C, 5C, and 6C, which depict the ion angular distribution functions corresponding to the ion energy distribution functions of FIGS. 4B, 5B, and 6B, respectively, in accordance with one embodiment of the present invention.

Therefore, it should be understood that as the blocking capacitor BC is set to control the average ion energy distribution function within the plasma during pulsed bias RF power operation, the blocking capacitor BC setting correspondingly adjusts the average ion angular distribution function. And, the average ion angular distribution function within the plasma becomes less orthogonally related to the substrate 105, as the ion energy distribution function shifts toward lower ion energies, as the capacitance of the blocking capacitor BC increases, vice-versa. However, it should be appreciated that changes in the ion angular distribution function of the plasma is a secondary effect of changing the capacitance of the blocking capacitor BC, whereas changes the ion energy distribution function within the plasma is a primary effect of changing the capacitance of the blocking capacitor BC.

FIGS. 7A, 8A, and 9A show plots of electron density, plasma potential (V), and DC bias voltage build up on the substrate 105 for a single pulse period in a pulsed bias RF power supply mode for blocking capacitor BC capacitance values of 1 nF, 500 nF, and 1000 nF, respectively, in accordance with one embodiment of the present invention. The plasma generation specifications are the same for each of FIGS. 7A, 8A, and 9A. Specifically, the plasma is generated at a pressure of 10 mT, a gas flow of 200 sccm of Ar, a TCP coil power of 500 W, an RF power frequency of 10 MHz, a bias pulse repetition frequency (PRF) of 5 kHz, and a 25% bias pulse duty cycle. Therefore, the variation in a given plot between FIGS. 7A, 8A, and 9A is due to the change in capacitance setting of the blocking capacitor BC in the IEADF control circuit 115.

In FIG. 7A, the electron density plot 701 corresponds to the scale on the left side of the chart, and both the plasma potential plot 702 and the DC bias voltage plot 703 correspond to the scale on the right side of the chart. In FIG. 8A, the electron density plot 801 corresponds to the scale on the left side of the chart, and both the plasma potential plot 802 and the DC bias voltage plot 803 correspond to the scale on the right side of the chart. In FIG. 9A, the electron density plot 901 corresponds to the scale on the left side of the chart, and both the plasma potential plot 902 and the DC bias voltage plot 903 correspond to the scale on the right side of the chart.

In comparing the DC bias voltage plots 703, 803, and 903 of FIGS. 7A, 8A, and 9A, respectively, it is seen that the rate at which the DC bias voltage increases upon initiation of the bias RF pulse is dependent on the capacitance setting of the blocking capacitor BC. At the smaller blocking capacitor BC capacitance setting of 1 nF, the DC bias voltage rate of increase is very fast due to the rapid discharge of the blocking capacitor BC. Then, at the higher blocking capacitor BC capacitance setting of 500 nF, the DC bias voltage rate of increase is slower due to the slower discharge of the blocking capacitor BC. Then, at the higher blocking capacitor BC capacitance setting of 1000 nF, the DC bias voltage rate of increase is slower due to the slower discharge of the blocking capacitor BC. As previously discussed, the effect on the plasma potential is dependent on the DC bias voltage behavior at the bias electrode 104, as influenced by the capacitance setting of the blocking capacitor BC. Therefore, the plasma potential plots 702, 802, and 902 are correlated to the DC bias voltage plots 703, 803, and 903, respectively.

Figure 7B:
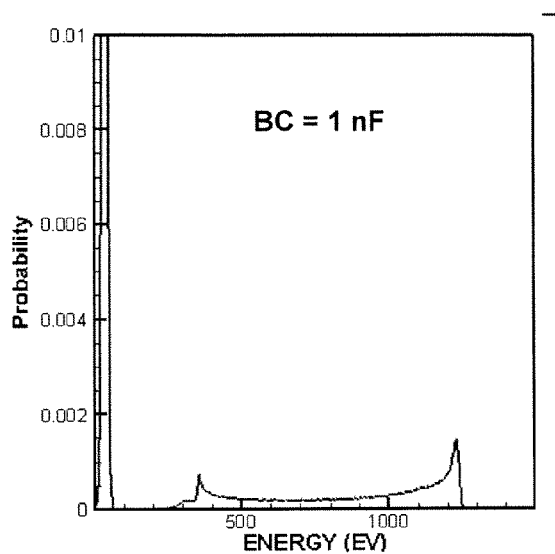
FIGS. 7B, 8B, 9B show ion energy distribution functions within the plasma corresponding to the pulsed bias RF power operations depicted in FIGS. 7A, 8A, and 9A, respectively, in accordance with one embodiment of the present invention.
Figure 8B:
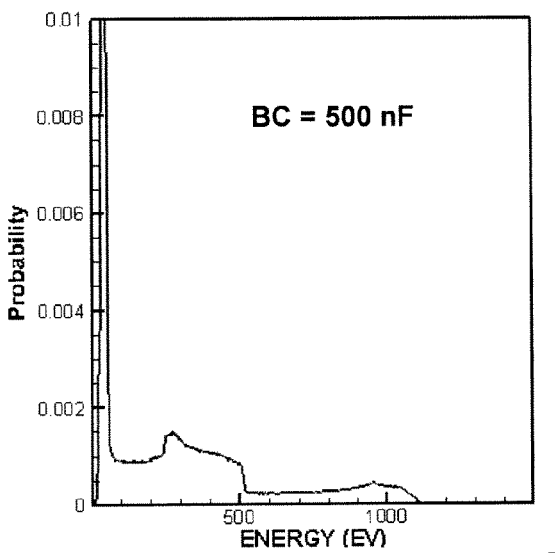
Figure 9B:
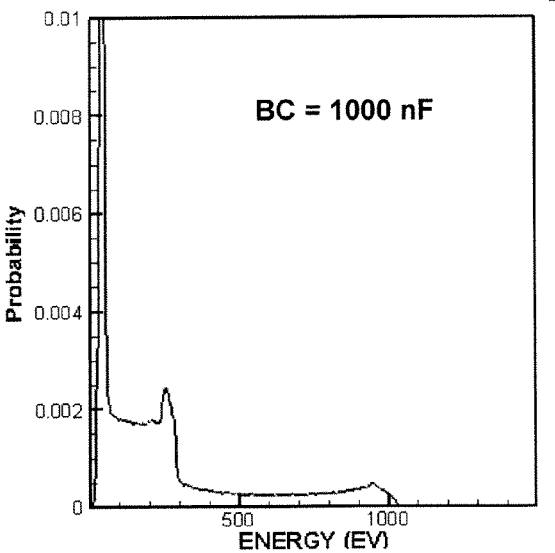

FIGS. 7B, 8B, 9B show ion energy distribution functions within the plasma corresponding to the pulsed bias RF power operations depicted in FIGS. 7A, 8A, and 9A, respectively, in accordance with one embodiment of the present invention. Comparison of the ion energy distribution functions of FIGS. 7B, 8B, and 9B shows that with the lower capacitance blocking capacitor BC setting, the correspondingly higher rate of increase in plasma potential during the bias RF power pulse causes a shift in the ion energy distribution function toward higher ion energy. Then, as the blocking capacitor BC capacitance setting is increased, the ion energy distribution function shifts toward lower ion energies. As previously discussed, this is due to the longer discharge time of the higher capacitance blocking capacitor BC, which in turn reduces the overall bias to which the ions are exposed during each bias RF power pulse, thereby preventing as many ions from reaching higher energy states.

Figure 9C:
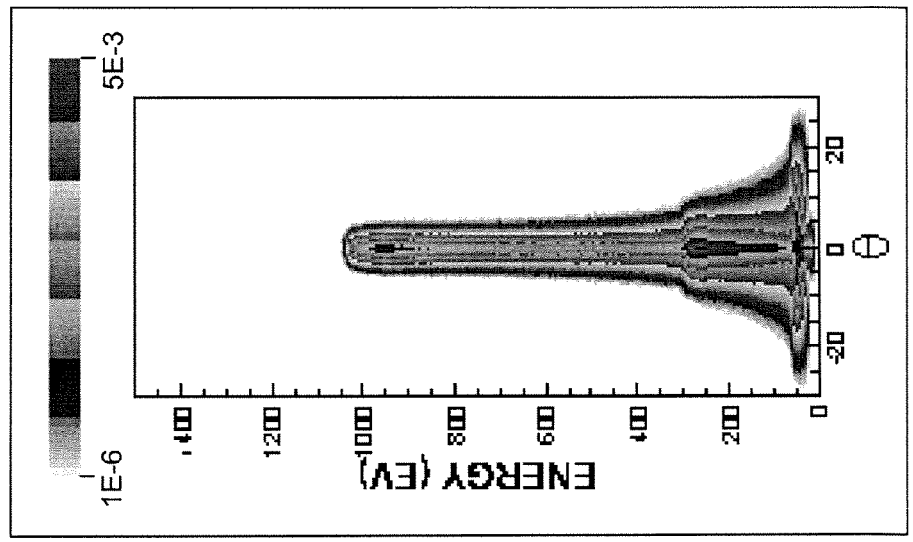
FIGS. 7C, 8C, 9C show the ion angular distribution functions corresponding to the ion energy distribution functions of FIGS. 7B, 8B, and 9B, respectively, in accordance with one embodiment of the present invention.
Figure 8C:
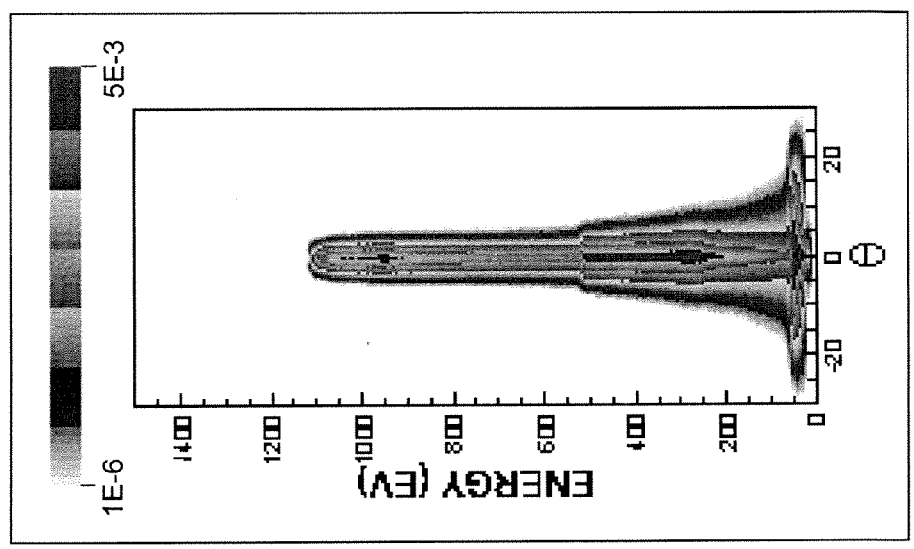
Figure 7C:
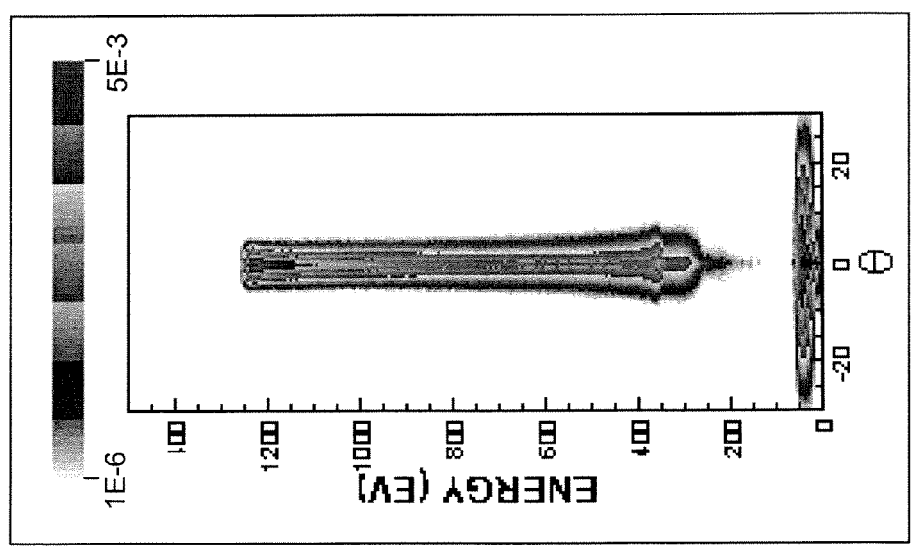

FIGS. 7C, 8C, 9C show the ion angular distribution functions corresponding to the ion energy distribution functions of FIGS. 7B, 8B, and 9B, respectively, in accordance with one embodiment of the present invention. Comparison of FIGS. 7C, 8C, and 9C shows that the ion angular distribution functions become more orthogonally related to the substrate 105 as the ion energy distribution function moves toward higher ion energy. Again, this is because ions of higher energy are more strongly attracted toward the substrate 105 and move in a more direct path toward the substrate 105.

Figure 10B:
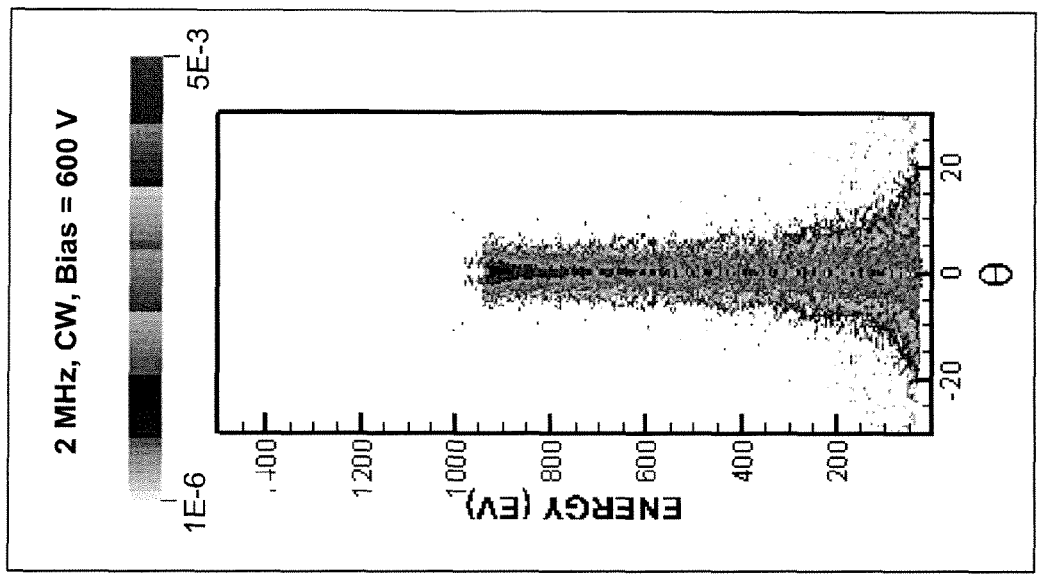
FIG. 10B shows an ion angular distribution function corresponding to the ion energy distribution function of FIG. 10A, in accordance with one embodiment of the present invention.
Figure 10A:
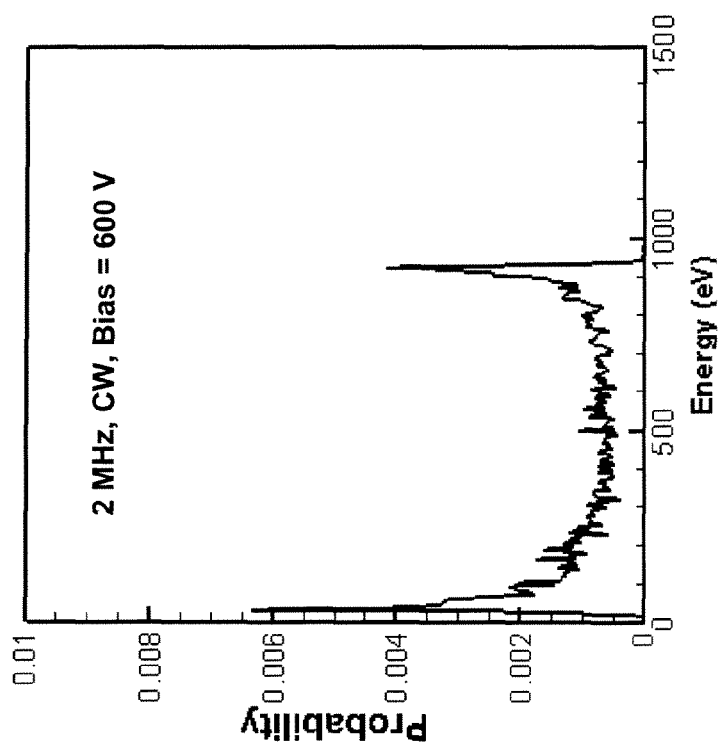
FIG. 10A shows an ion energy distribution function for a continuous wave bias RF power application at an RF frequency of 2 MHz, in accordance with one embodiment of the present invention.

FIG. 10A shows an ion energy distribution function for a continuous wave bias RF power application at an RF frequency of 2 MHz, in accordance with one embodiment of the present invention. Other than the continuous wave bias RF power supply, the plasma generation specifications associated with FIG. 10A are the same as those associated with the FIGS. 7A-7C, 8A-8C, and 9A-9C. Therefore, in comparing the ion energy distribution function of FIG. 10A with that of FIG. 7B, it should be appreciated that an appropriately set capacitance of the blocking capacitor BC in the pulsed bias RF power supply mode is capable of generating an ion energy distribution function that resembles the ion energy distribution function of a continuous wave bias RF power supply mode.

FIG. 10B shows an ion angular distribution function corresponding to the ion energy distribution function of FIG. 10A, in accordance with one embodiment of the present invention. In comparing the ion angular distribution function of FIG. 10B with that of FIG. 7C, it should be appreciated that an appropriately set capacitance of the blocking capacitor BC in the pulsed bias RF power supply mode is capable of generating an ion angular distribution function that resembles the ion angular distribution function of a continuous wave bias RF power supply mode.

Figure 11:
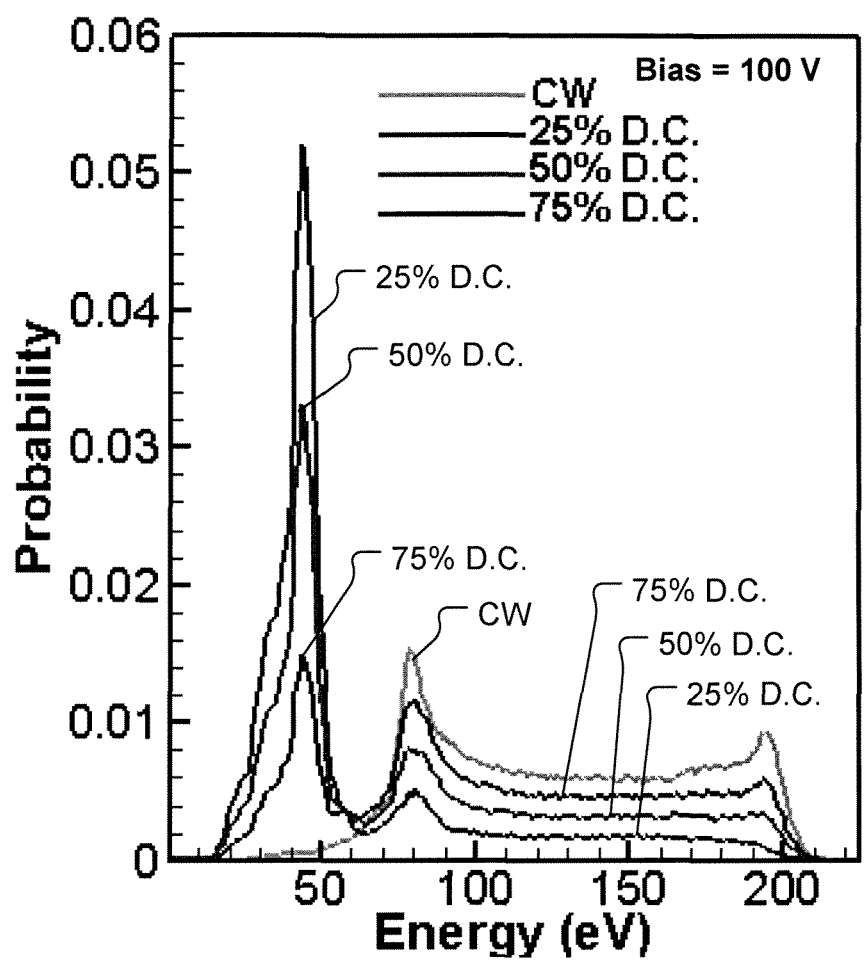
FIG. 11 shows a number of plots of ion energy distribution function for different duty cycles (D.C.) in pulsed bias RF power supply mode, along with a plot of ion energy distribution function for a continuous wave bias RF power supply mode, in accordance with one embodiment of the present invention.

FIG. 11 shows a number of plots of ion energy distribution function for different duty cycles (D.C.) in pulsed bias RF power supply mode, along with a plot of ion energy distribution function for a continuous wave bias RF power supply mode, in accordance with one embodiment of the present invention. For the plots in FIG. 11, the plasma is generated at a pressure of 10 mT, a gas flow of 200 sccm of Ar, a TCP coil power of 500 W, an RF power frequency of 10 MHz, and a of 5 kHz. As shown in FIG. 11, as the duty cycle (D.C.) increases in the pulsed bias RF power supply mode of operation, the ion energy distribution function moves toward higher energy, and ultimately toward the ion energy distribution function of the continuous wave bias RF power supply mode of operation.

Figure 12:
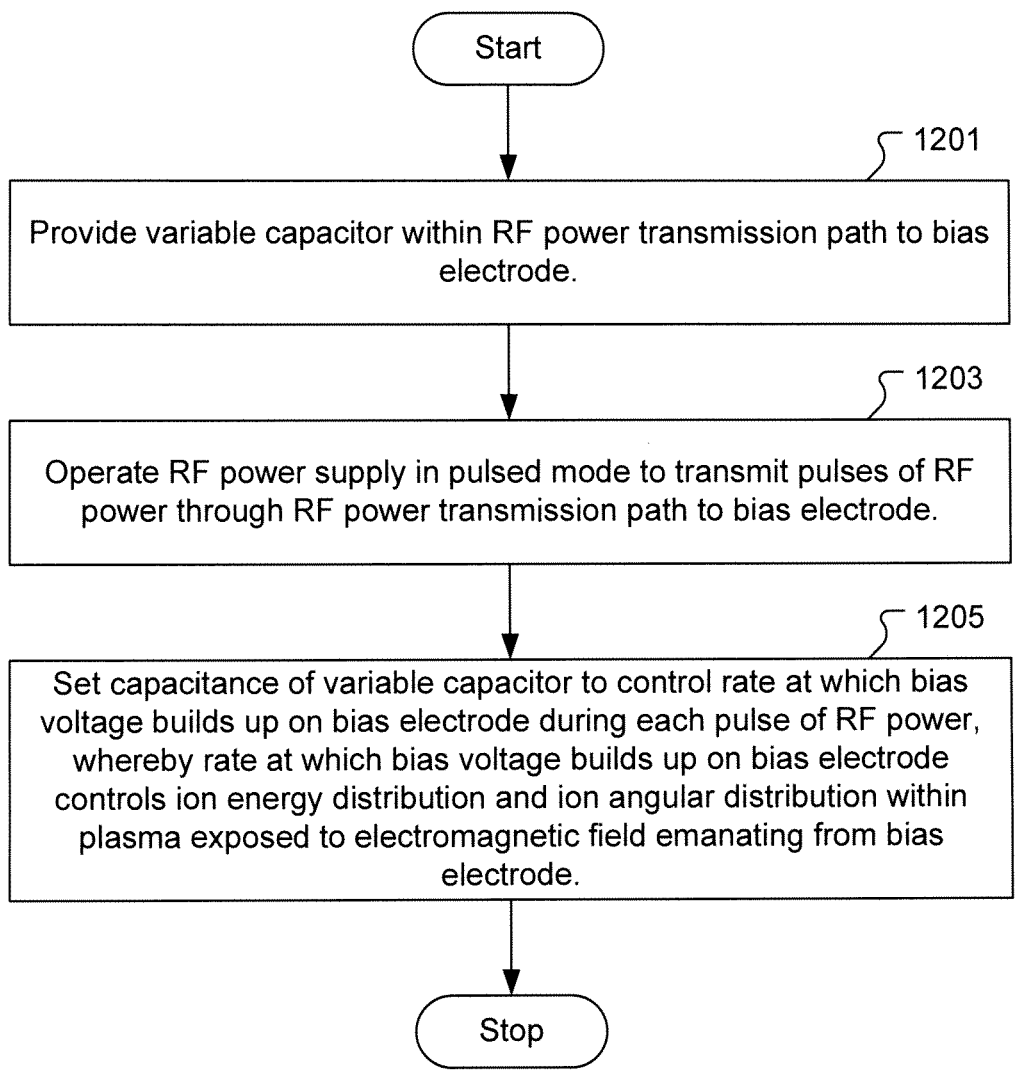
FIG. 12 shows a flowchart of a method for controlling ions during plasma processing of a substrate, in accordance with one embodiment of the present invention.

FIG. 12 shows a flowchart of a method for controlling ions during plasma processing of a substrate, in accordance with one embodiment of the present invention. The method includes an operation 1201 for providing a variable capacitor within a radiofrequency (RF) power transmission path to a bias electrode. In one embodiment, the bias electrode is embedded within an electrostatic chuck. The variable capacitor is provided in addition to an impedance matching circuit within the RF power transmission path to the bias electrode. In one embodiment, the variable capacitor is electrically connected between the impedance matching circuit and the bias electrode. The method also includes an operation 1203 for operating an RF power supply in a pulsed mode to transmit pulses of RF power through the RF power transmission path to the bias electrode. The method also includes an operation 1205 for setting a capacitance of the variable capacitor to control a rate at which a DC bias voltage builds up on a substrate present above the bias electrode during each pulse of RF power, whereby the rate at which the DC bias voltage builds up on the substrate controls an ion energy distribution and an ion angular distribution within a plasma exposed to an electromagnetic field emanating from the substrate.

The method can also include an operation for decreasing the capacitance of the variable capacitor to increase the rate at which the DC bias voltage builds up on the substrate during each pulse of RF power and thereby controlling the ion energy distribution within the plasma to shift toward higher energy. Controlling the ion energy distribution within the plasma to shift toward higher energy causes the ion angular distribution within the plasma to shift to a more orthogonal trajectory relative to the substrate.

The method can also include an operation for increasing the capacitance of the variable capacitor to decrease the rate at which the DC bias voltage builds up on the substrate during each pulse of RF power and thereby controlling the ion energy distribution within the plasma to shift toward lower energy. Controlling the ion energy distribution within the plasma to shift toward lower energy causes the ion angular distribution within the plasma to shift to a less orthogonal trajectory relative to the substrate.

In the operation 1203, operating the RF power supply in the pulsed mode to transmit pulses of RF power includes generating RF power pulses in accordance with a pulse repetition frequency and a duty cycle. Increasing the duty cycle causes a time average of the ion energy distribution within the plasma to shift toward higher energy. Decreasing the duty cycle causes the time average of the ion energy distribution within the plasma to shift toward lower energy. Increasing the pulse repetition frequency causes a time average of the ion energy distribution within the plasma to shift toward higher energy. Decreasing the pulse repetition frequency causes the time average of the ion energy distribution within the plasma to shift toward lower energy.

As discussed herein, implementation of the IEADF control circuit 115, and in particular the variable capacitance blocking capacitor BC, in the bias RF power supply path provides for control of ion energy and angular distribution functions when operating in the pulsed bias RF power supply mode. Also, the combination of blocking capacitor BC capacitance setting, pulse repetition frequency (PRF), and a pulse duty cycle (PDC) of the supplied bias RF power can be defined to achieve a desired ion energy and angular distribution function within the plasma. And, the blocking capacitor BC capacitance setting can be adjusted during plasma processing operations to effect changes in the ion energy and angular distribution functions of the plasma.

As demonstrated herein, when operating the pulsed bias RF power through the parent sinusoidal frequency, the tunable blocking capacitor BC can generate IEADFs that closely resemble IEADFs that would be generated in a continuous wave bias RF power mode at other parent sinusoidal frequencies, but with distinct separation of low and high energy ion populations. Due the blocking capacitor BC charging and discharging and its associated time scale with respect to the bias pulse repetition time period, the tunable blocking capacitor BC can alter the substrate DC bias voltage (average energy with which ions are accelerated to substrate) and its time evolution significantly such that the ion population gets distributed differently in the low and high energy states. This enables a unique way to control the IEADF incident upon the substrate and the resulting feature profiles that are etched on the substrate.

Implementation and operation of the blocking capacitor BC, as disclosed herein, provides for control of IEADFs within the plasma and relative populations of low and high energy ions arriving at the substrate during pulsed bias RF power operation without the use of special RF or waveform generators. Also, by using the tunable blocking capacitor BC with the bias RF power supply path (attached to the circuitry of the bias match circuit 113), it is possible to control both the substrate DC bias voltage and the relative population of ion energies from low to high. This also results in an IEADF from pulsed bias RF power supply mode that resembles an IEADF of a continuous wave bias RF power supply mode at another parent RF frequency.

In view of the disclosure herein, it should be understood that use of the tunable blocking capacitor BC in conjunction with the pulsed bias RF power supply mode provides for control of ion energy and angular distribution near the substrate. The tunable, i.e., variable, blocking capacitor provides for control of the charge distribution near the substrate, the DC bias voltage on the substrate, sheath collapse, and ion energy and angular distribution functions. Also, the temporal behavior of the DC bias voltage on the substrate is dependent on the magnitude of capacitance of blocking capacitor BC. Again, it should be appreciated that the methods and systems disclosed herein for using the blocking capacitor BC to control the IEADF during the pulsed bias RF power supply mode of operation do not require the use of special RF or waveform generators.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for controlling ions during plasma processing of a substrate, comprising:

providing a variable capacitor within a radiofrequency (RF) power transmission path to a bias electrode, the variable capacitor provided in addition to an impedance matching circuit within the RF power transmission path to the bias electrode;

operating an RF power supply in a pulsed mode to transmit pulses of RF power through the RF power transmission path to the bias electrode; and setting a capacitance of the variable capacitor to control a rate at which a direct current (DC) bias voltage builds up on a substrate present above the bias electrode during each pulse of RF power, whereby the rate at which the DC bias voltage builds up on the substrate controls an ion energy distribution and an ion angular distribution within a plasma exposed to an electromagnetic field emanating from the substrate.

2. The method for controlling ions during plasma processing of the substrate as recited in claim 1, wherein the variable capacitor is electrically connected between the impedance matching circuit and the bias electrode.

3. The method for controlling ions during plasma processing of the substrate as recited in claim 1, wherein the bias electrode is embedded within an electrostatic chuck.

4. The method for controlling ions during plasma processing of the substrate as recited in claim 1, further comprising:
decreasing the capacitance of the variable capacitor to increase the rate at which the DC bias voltage builds up on the substrate during each pulse of RF power and thereby controlling the ion energy distribution within the plasma to shift toward higher energy.

5. The method for controlling ions during plasma processing of the substrate as recited in claim 4, wherein controlling the ion energy distribution within the plasma to shift toward higher energy causes the ion angular distribution within the plasma to shift to a more orthogonal trajectory relative to the substrate.

6. The method for controlling ions during plasma processing of the substrate as recited in claim 1, further comprising:
increasing the capacitance of the variable capacitor to decrease the rate at which the DC bias voltage builds up on the substrate during each pulse of RF power and thereby controlling the ion energy distribution within the plasma to shift toward lower energy.

7. The method for controlling ions during plasma processing of the substrate as recited in claim 6, wherein controlling the ion energy distribution within the plasma to shift toward lower energy causes the ion angular distribution within the plasma to shift to a less orthogonal trajectory relative to the substrate.

8. The method for controlling ions during plasma processing of the substrate as recited in claim 1, wherein operating the RF power supply in the pulsed mode to transmit pulses of RF power includes generating RF power pulses in accordance with a pulse repetition frequency and a duty cycle.

9. The method for controlling ions during plasma processing of the substrate as recited in claim 8, wherein increasing the duty cycle causes a time average of the ion energy distribution within the plasma to shift toward higher energy, and wherein decreasing the duty cycle causes the time average of the ion energy distribution within the plasma to shift toward lower energy.

10. The method for controlling ions during plasma processing of the substrate as recited in claim 8, wherein increasing the pulse repetition frequency causes a time average of the ion energy distribution within the plasma to shift toward higher energy, and wherein decreasing the pulse repetition frequency causes the time average of the ion energy distribution within the plasma to shift toward lower energy.

11. The method for controlling ions during plasma processing of the substrate as recited in claim 1, wherein the variable capacitor is a first variable capacitor, and wherein the method further includes providing a second variable capacitor within the RF power transmission path to the bias electrode, the second variable capacitor provided in addition to the impedance matching circuit within the RF power transmission path to the bias electrode.

12. The method for controlling ions during plasma processing of the substrate as recited in claim 11, wherein the second variable capacitor is electrically connected in a serial manner with the first variable capacitor.

13. The method for controlling ions during plasma processing of the substrate as recited in claim 11, wherein the second variable capacitor is electrically connected in a parallel manner with the first variable capacitor.

14. A method for controlling ions during plasma processing of a substrate, comprising:
providing a variable capacitor within a radiofrequency (RF) power transmission path to a bias electrode, the variable capacitor provided in addition to an impedance matching circuit within the RF power transmission path to the bias electrode;
operating an RF power supply in a pulsed mode to transmit pulses of RF power through the RF power transmission path to the bias electrode;
at a first time, decreasing a capacitance of the variable capacitor to increase a rate at which a direct current (DC) bias voltage builds up on a substrate present above the bias electrode during each pulse of RF power and thereby controlling the ion energy distribution within the plasma to shift toward higher energy so as to cause the ion angular distribution within the plasma to shift to a more orthogonal trajectory relative to the substrate; and
at a second time different from the first time, increasing the capacitance of the variable capacitor to decrease the rate at which the DC bias voltage builds up on the substrate during each pulse of RF power and thereby controlling the ion energy distribution within the plasma to shift toward lower energy so as to cause the ion angular distribution within the plasma to shift to a less orthogonal trajectory relative to the substrate.

15. The method for controlling ions during plasma processing of the substrate as recited in claim 14, wherein operating the RF power supply in the pulsed mode to transmit pulses of RF power includes generating RF power pulses in accordance with a pulse repetition frequency and a duty cycle.

16. The method for controlling ions during plasma processing of the substrate as recited in claim 15, wherein increasing the duty cycle causes a time average of the ion energy distribution within the plasma to shift toward higher energy, and wherein decreasing the duty cycle causes the time average of the ion energy distribution within the plasma to shift toward lower energy.

17. The method for controlling ions during plasma processing of the substrate as recited in claim 15, wherein increasing the pulse repetition frequency causes a time average of the ion energy distribution within the plasma to shift toward higher energy, and wherein decreasing the pulse repetition frequency causes the time average of the ion energy distribution within the plasma to shift toward lower energy.

18. The method for controlling ions during plasma processing of the substrate as recited in claim 14, wherein the variable capacitor is electrically connected between the impedance matching circuit and the bias electrode.

19. The method for controlling ions during plasma processing of the substrate as recited in claim 14, wherein the bias electrode is embedded within an electrostatic chuck.

20. The method for controlling ions during plasma processing of the substrate as recited in claim 14, further comprising:
decreasing the capacitance of the variable capacitor to increase the rate at which the DC bias voltage builds up on the substrate during each pulse of RF power and thereby controlling the ion energy distribution within the plasma to shift toward higher energy.

\* \* \* \* \*